US012051967B2

(12) United States Patent
Probst et al.

(10) Patent No.: US 12,051,967 B2
(45) Date of Patent: Jul. 30, 2024

(54) INTEGRATED TRANSISTOR AND RESISTOR-DIODE-CAPACITOR SNUBBER

(71) Applicant: SEMICONDUCTOR COMPONENTS INDUSTRIES, LLC, Phoenix, AZ (US)

(72) Inventors: Dean E. Probst, West Jordan, UT (US); Joseph Andrew Yedinak, Mountain Top, PA (US); Balaji Padmanabhan, Chandler, AZ (US); Peter A Burke, Portland, OR (US); Jeffery A. Neuls, Beaverton, OR (US); Ashok Challa, Milpitas, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 161 days.

(21) Appl. No.: 17/806,597

(22) Filed: Jun. 13, 2022

(65) Prior Publication Data
US 2022/0407411 A1 Dec. 22, 2022

Related U.S. Application Data

(60) Provisional application No. 63/202,619, filed on Jun. 17, 2021.

(51) Int. Cl.
*H02M 1/34* (2007.01)
*H01L 27/07* (2006.01)
(52) U.S. Cl.
CPC .......... *H02M 1/34* (2013.01); *H01L 27/0727* (2013.01)
(58) Field of Classification Search
CPC .................................................. H02M 1/34

USPC .......................................................... 327/427
See application file for complete search history.

(56) References Cited

U.S. PATENT DOCUMENTS

| | | | |
|---|---|---|---|
| 2006/0262577 A1* | 11/2006 | Schenk | H02M 1/34 363/50 |
| 2010/0163950 A1 | 7/2010 | Gladish et al. | |
| 2016/0118380 A1 | 4/2016 | Lui et al. | |
| 2016/0276923 A1* | 9/2016 | Hayakawa | H02M 1/34 |
| 2017/0194486 A1 | 7/2017 | Venkatraman et al. | |
| 2018/0091039 A1* | 3/2018 | Bastholm | H02M 1/34 |
| 2018/0196129 A1* | 7/2018 | Peng | G01S 7/5202 |

(Continued)

OTHER PUBLICATIONS

Richard Chung, "Designing the Resistor-Capacitor-Diode (RCD) Snubber of a Flyback Converter," www.planetanalog.com/category/glob, Aug. 7, 2014.

(Continued)

*Primary Examiner* — Tomi Skibinski
(74) *Attorney, Agent, or Firm* — Brake Hughes Bellermann LLP

(57) ABSTRACT

In some aspects, the techniques described herein relate to a circuit including: a metal-oxide semiconductor field-effect transistor (MOSFET) including a gate, a source, and a drain; and a snubber circuit coupled between the drain and the source, the snubber circuit including: a diode having a cathode and an anode, the cathode being coupled with the drain; a capacitor having a first terminal coupled with the anode, and a second terminal coupled with the source; and a resistor having a first terminal coupled with the anode and the first terminal of the capacitor, and a second terminal coupled with the source.

20 Claims, 7 Drawing Sheets

(56) References Cited

U.S. PATENT DOCUMENTS

| | | | |
|---|---|---|---|
| 2021/0328523 A1* | 10/2021 | Chen | H02M 7/4835 |
| 2022/0077290 A1 | 3/2022 | Loechelt et al. | |
| 2022/0109363 A1* | 4/2022 | Lin | H02M 1/0048 |
| 2022/0271669 A1* | 8/2022 | Yakubo | H02M 1/348 |
| 2023/0046316 A1* | 2/2023 | Liu | H01H 33/596 |
| 2023/0403003 A1* | 12/2023 | Roig-Guitart | H03K 17/161 |

OTHER PUBLICATIONS

Rudy Severns, "Design of snubbers for power circuits." International Rectifier Corporation, 2006.

Jingling Chen, "Design Optimal Built-In Snubber in Trench Field Plate Power MOSFET for Superior EMI and Efficiency Performance," SISPAD 2015.

Toshiba Electronic Devices & Storage Corporation, "Power Mosfet Selecting Mosffets and Consideration for Circuit Design," Jul. 26, 2018.

Hiroaki Yamashita et al., "Low Noise Superjunction MOSFET with Integrated Snubber Structure," May 13, 2018.

\* cited by examiner

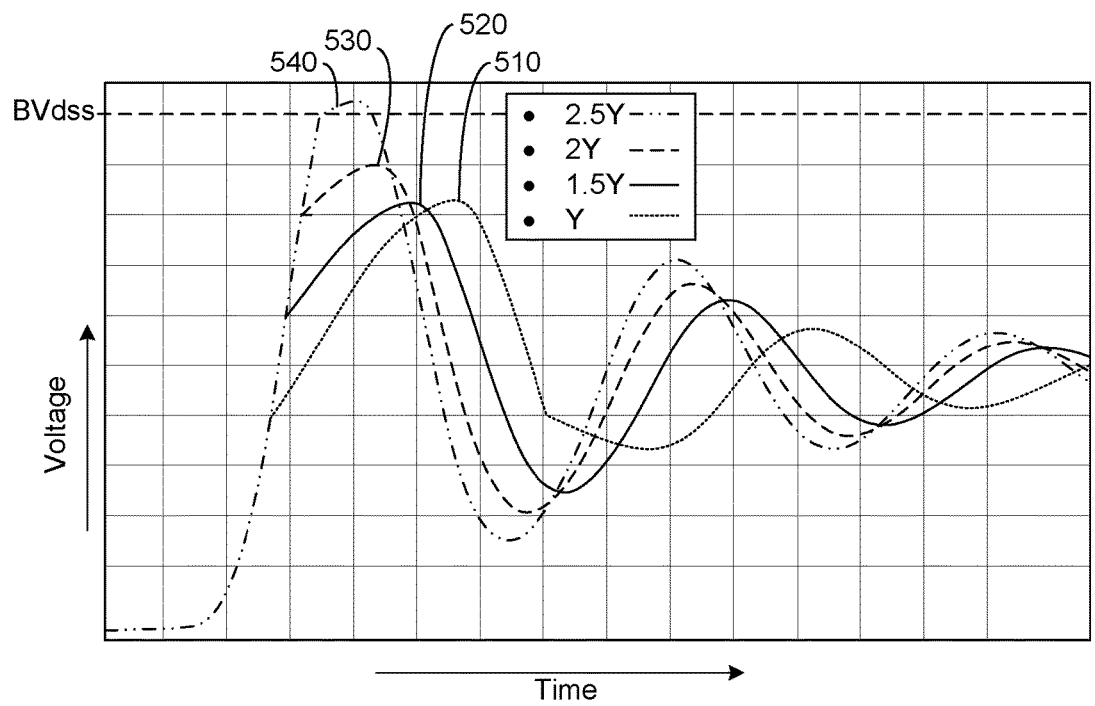
FIG. 5
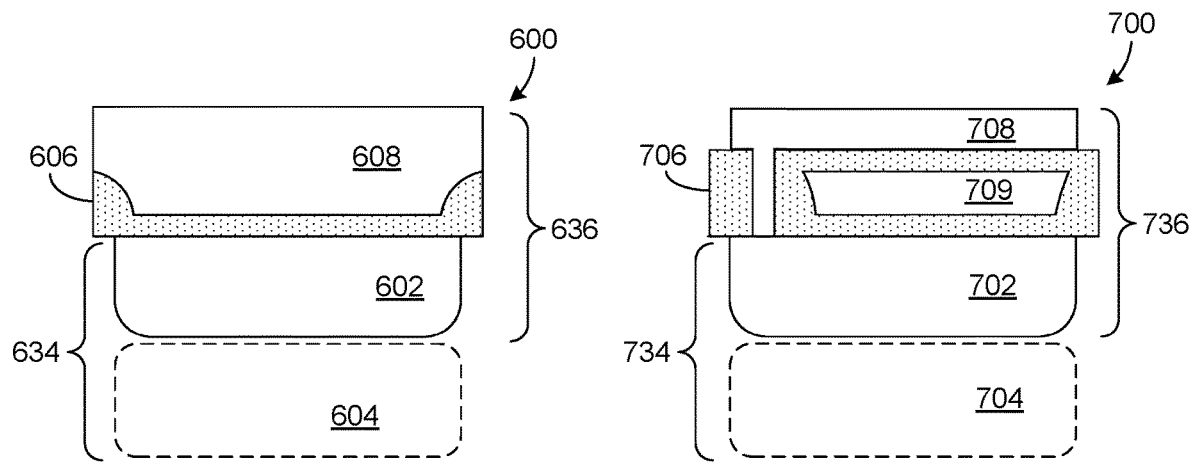
FIG. 6
FIG. 7

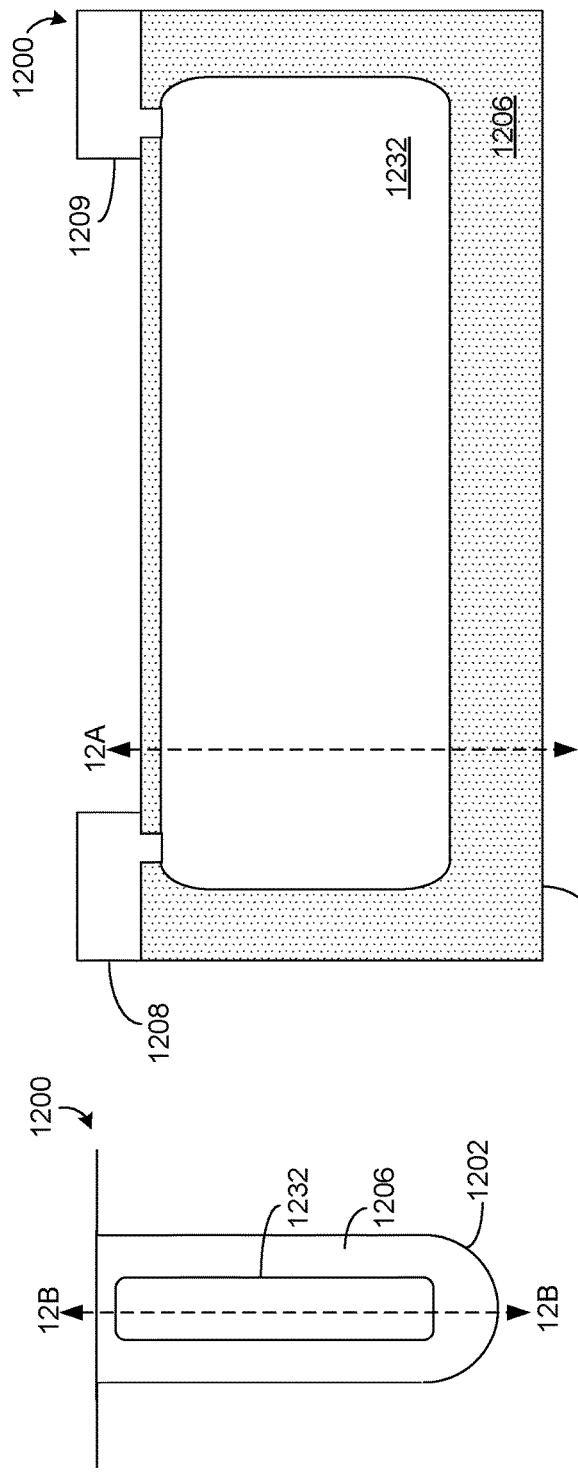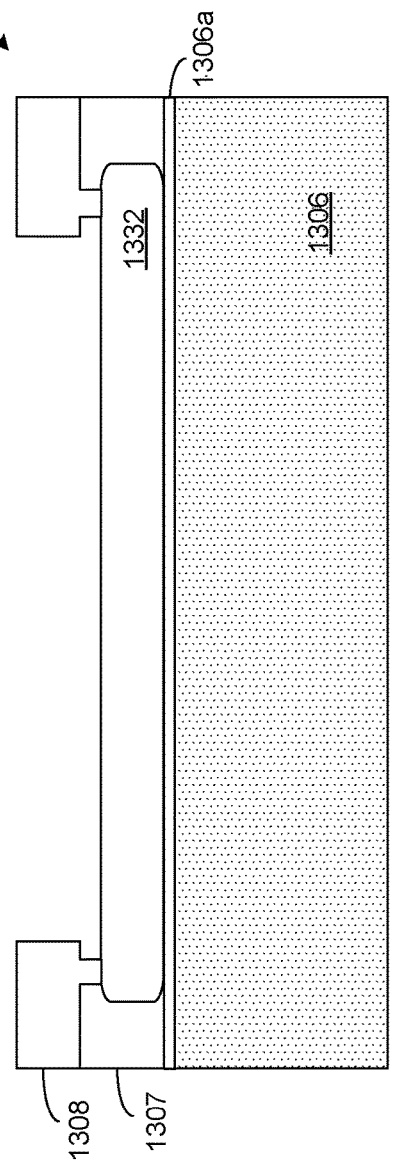

INTEGRATED TRANSISTOR AND RESISTOR-DIODE-CAPACITOR SNUBBER

RELATED APPLICATION

This application claims priority to and the benefit of U.S. Provisional Application No. 63/202,619, filed Jun. 17, 2021, which is incorporated herein by reference in its entirety.

TECHNICAL FIELD

This description relates to semiconductor devices and, more particularly, to transistor devices, such as metal-oxide field effect transistors implemented with a resistor-diode-capacitor snubber circuit.

BACKGROUND

Power transistors are used in a number of applications, such as consumer electronics, automotive electronics, industrial electronics, etc. For example, power transistors are used in power conversion circuits, such as direct-current to direct-current (DC to DC) power converters (e.g., synchronous buck converters), where a power output of the converter is coupled to a switch node between a high-side (HS) transistor and a low-side (LS) transistor. Parasitic inductances in the HS and LS transistors (e.g., vertical metal-oxide-semiconductor field-effect transistors (MOSFETs)) and/or in a printed circuit board (PCB) used to implement an associated power converter, combined with an output capacitance of the LS transistor ($C_{oss}$) can cause overshoot and/or ringing at the switch node. Such overshoot and/or ringing can cause a voltage on the switch node to exceed a breakdown voltage of the LS transistor, such as a drain-to-source breakdown voltage ($BV_{dss}$) of a LS MOSFET. When $BV_{dss}$ is exceeded, power conversion efficiency of an associated power converter can be reduced and/or damage the transistor occur. In implementations including shielded gate MOSFETs, low shield resistance reduces losses associated with shield displacement currents, but can also increase, contribute to overshoot.

One approach used to prevent such power efficiency loss and/or potential transistor damage, e.g., for a given implementation, is to increase $BV_{dss}$ of the LS transistor. However, increasing $BV_{dss}$ also increases on-state resistance of the LS transistor, such as drain-to-source on-state resistance (Rdson), which results in higher resistive losses, and also decreases power conversion efficiency.

Another approach that is used to reduce overshoot and/or reduce ringing is to couple additional capacitors and/or resistors to a switch node of an associated power converter. However, charging and discharging such extra capacitors in correspondence with a voltage on the switch node contributes to power conversion efficiency losses. Additionally, such extra capacitors take up PCB space (e.g., increasing production costs) and also add more parasitic inductance to the circuit, which can be counterproductive to reducing overshoot and/or ringing.

SUMMARY

In some aspects, the techniques described herein relate to a circuit including: a metal-oxide semiconductor field-effect transistor (MOSFET) including a gate, a source, and a drain; and a snubber circuit coupled between the drain and the source, the snubber circuit including: a diode having a cathode and an anode, the cathode being coupled with the drain; a capacitor having a first terminal coupled with the anode, and a second terminal coupled with the source; and a resistor having a first terminal coupled with the anode and the first terminal of the capacitor, and a second terminal coupled with the source.

In some aspects, the techniques described herein relate to a circuit, wherein a breakdown voltage of the diode is less than a breakdown of the MOSFET, the snubber circuit being configured to: charge the capacitor when a voltage on the drain exceeds a breakdown voltage of the diode; and discharge the capacitor when a voltage on the anode is greater than the voltage on the drain.

In some aspects, the techniques described herein relate to a circuit, wherein charging the capacitor when the voltage on the drain exceeds the breakdown voltage of the diode includes charging the capacitor to a voltage that is equal to a drain-to-source voltage of the MOSFET minus the breakdown voltage of the diode.

In some aspects, the techniques described herein relate to a circuit, wherein discharging the capacitor includes discharging the capacitor via the resistor.

In some aspects, the techniques described herein relate to a circuit, wherein a breakdown voltage of the diode is less that a drain-to-source breakdown voltage of the MOSFET.

In some aspects, the techniques described herein relate to a circuit, wherein the MOSFET and the snubber circuit are monolithically included in a semiconductor die.

In some aspects, the techniques described herein relate to a circuit, wherein: the MOSFET is included in a first semiconductor die; and the snubber circuit is included in a second semiconductor die that is co-packaged with the first semiconductor die.

In some aspects, the techniques described herein relate to a circuit, wherein: the MOSFET, the diode and the resistor are included in a semiconductor die; and the capacitor is a surface-mount capacitor disposed on the semiconductor die.

In some aspects, the techniques described herein relate to a circuit, wherein: the circuit is included in a power converter circuit; and a breakdown voltage of the diode is greater than a supply voltage of the power converter circuit.

In some aspects, the techniques described herein relate to a semiconductor device including: a semiconductor region of a first conductivity type; an implant of a second conductivity type disposed in the semiconductor region, the second conductivity type being opposite the first conductivity type; a metal-oxide semiconductor field-effect transistor (MOSFET) disposed in the semiconductor region, the MOSFET including: a gate; a source of the first conductivity type; and a drain included in the semiconductor region; a capacitor having: a first terminal that is at least one of: included, at least in part, in the implant; or coupled with the implant; a second terminal coupled with the source; and a dielectric disposed between the first terminal and the second terminal; and a resistor having: a first terminal coupled with the source; and a second terminal coupled with the implant, the implant including an anode of a diode, and the semiconductor region including a cathode of the diode.

In some aspects, the techniques described herein relate to a semiconductor device, where a drain-to source breakdown voltage of the MOSFET is greater than a breakdown voltage of the diode.

In some aspects, the techniques described herein relate to a semiconductor device, wherein: the dielectric is disposed on the implant on a surface of the semiconductor region; and the second terminal of the capacitor includes a metal layer disposed on the dielectric of the capacitor, the metal layer being coupled with the source.

In some aspects, the techniques described herein relate to a semiconductor device, wherein: the capacitor is a metal-insulator-metal (MIM) capacitor; the first terminal of the capacitor includes a first metal layer disposed on the implant; and the second terminal of the capacitor includes a second metal layer disposed on the dielectric.

In some aspects, the techniques described herein relate to a semiconductor device, wherein the MIM capacitor is a vertical, serpentine MIM capacitor.

In some aspects, the techniques described herein relate to a semiconductor device, wherein: the capacitor is a metal-insulator-metal (MIM) capacitor; the second terminal of the capacitor includes: a first metal layer disposed on the MOSFET, the dielectric being disposed on the first metal layer; and a second metal layer disposed on the dielectric, the second metal layer being disposed on the dielectric and coupled with the first metal layer by at least one via formed through the dielectric; and the second terminal of the capacitor is disposed within the dielectric.

In some aspects, the techniques described herein relate to a semiconductor device, wherein: the dielectric is disposed on the implant; a metal layer is disposed on the dielectric, the metal layer being coupled with the implant by at least one contact formed through the dielectric; and the second terminal of the capacitor is disposed within the dielectric, the capacitor including a first capacitor coupled in parallel with a second capacitor.

In some aspects, the techniques described herein relate to a semiconductor device, wherein: the second terminal of the capacitor is disposed in a dielectric-lined trench disposed in the semiconductor region, the dielectric-lining of the trench including the dielectric of the capacitor; and the implant is disposed in a mesa of the semiconductor region adjacent to the dielectric-lined trench.

In some aspects, the techniques described herein relate to a semiconductor device including: a first semiconductor die including a metal-oxide-semiconductor field-effect transistor (MOSFET), the first semiconductor die including: a gate terminal of the MOSFET on a first surface; a source terminal of the MOSFET on the first surface; and a drain terminal of the MOSFET on a second surface, the second surface being opposite the first surface; a second semiconductor die including: a first terminal on a first surface; a second terminal on a second surface opposite the first surface; and a snubber circuit including: a diode having a cathode coupled with the second terminal of the second semiconductor die; a capacitor coupled between an anode of the diode and the first terminal of the second semiconductor die; and a resistor coupled between the anode and the first terminal of the second semiconductor die, such that the resistor is coupled in parallel with the capacitor; a die-attach paddle, the second surface of the first semiconductor die and the second surface of the second semiconductor die being disposed on the die-attach paddle, such that the die-attach paddle couples the drain terminal of the MOSFET with the second terminal of the second semiconductor die; and an electrical connector coupling the source terminal of the MOSFET with the first terminal of the second semiconductor die.

In some aspects, the techniques described herein relate to a semiconductor device, wherein a drain-to-source breakdown voltage of the MOSFET is greater than a breakdown voltage of the diode.

In some aspects, the techniques described herein relate to a semiconductor device, wherein the snubber circuit is configured to: charge the capacitor when a voltage on the drain terminal of the MOSFET exceeds the breakdown voltage of the diode; and discharge the capacitor when a voltage on the anode is greater than the voltage on the drain terminal.

BRIEF DESCRIPTION OF THE DRAWINGS

FIG. 5 is a graph illustrating the effect of diode breakdown voltage on operation of implementations of the RDC snubber circuit of FIG. 2.

FIG. 6 is a diagram illustrating a cross-sectional view of an integrated diode and capacitor that can be included in a RDC snubber circuit.

FIG. 7 is a diagram illustrating a cross-sectional view of an integrated diode and parallel capacitors that can be included in a RDC snubber circuit.

FIG. 12A is a cross-sectional view of a trench resistor that can be included in a RDC snubber circuit.

FIG. 12B is another cross-sectional view of the trench resistor of FIG. 12A.

FIG. 13 is a cross-sectional view of a planar resistor that can be included in a RDC snubber circuit.

Like reference symbols in the various drawings indicate like and/or similar elements.

DETAILED DESCRIPTION

Figure 1:
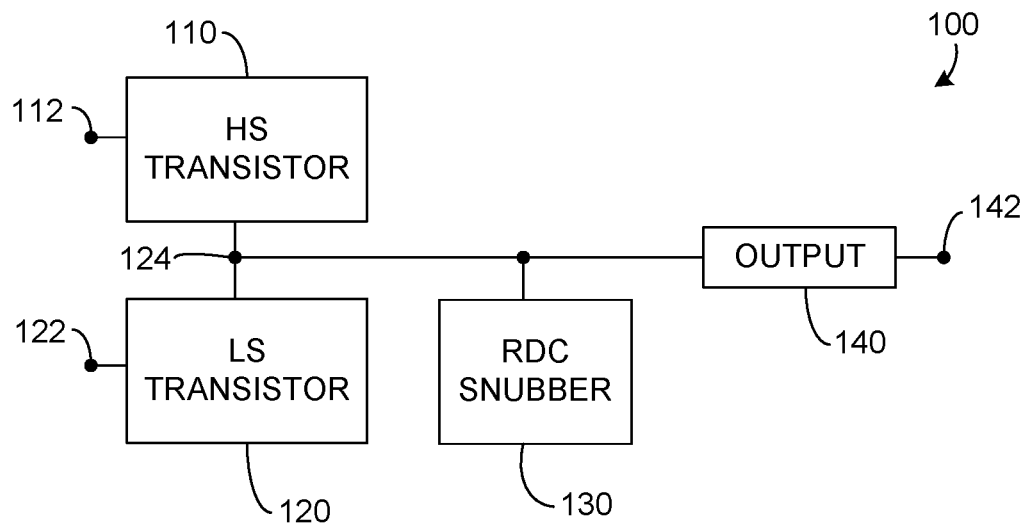
FIG. 1 is a block diagram illustrating a power converter including a resistor-diode-capacitor (RDC) snubber circuit.

This disclosure is directed to circuits and devices, e.g., semiconductor devices, that can be implemented in a power converter, such as direct-current to direct-current (DC-DC) power converter. The circuits and devices described herein, as compared to previous approaches, can reduce overshoot and/or ringing on a switch node of an associated power converter, while also reducing power conversion efficiency losses. For instance, the circuits and devices described herein include, or can be used to implement a resistor-diode-capacitor (RDC) snubber circuit that can be integrated with a transistor, such as a metal-oxide-semiconductor field transistor (MOSFET). Such an integrated RDC snubber circuit and MOSFET (or other transistor) can implement a low-side (LS) transistor in a power converter. In the approaches described herein, a RDC snubber can be configured to operate such that a capacitor of the RDC snubber charges when a switch node voltage of an associated power converter (e.g., a voltage on a drain of the MOSFET) exceeds a breakdown voltage of the diode, and discharges when a voltage on an anode of the diode is greater than the voltage on the switch node. In such approaches, the breakdown voltage of the diode can, by design, be less than a breakdown voltage of the LS transistor, e.g., a drain-to-source breakdown voltage ($BV_{dss}$) of a LS MOSFET.

For instance, in example implementations, the RDC snubber circuit can be configured such that it snubs voltage and/or current on the switch node (e.g., by charging the capacitor) to prevent overshoot and/or ringing when the switch node voltage exceeds the breakdown voltage of the diode, and discharges and/or prevents charging of the capacitor when a voltage on the anode of the diode is greater than a voltage on the drain (e.g., a voltage on the switch node). In such implementations, when the switch node voltage is below the breakdown voltage of the diode, the resistor can conduct leakage current of the diode to reduce or prevent charging of the capacitor and/or to discharge the capacitor. Further, charge stored on the capacitor of the RDC snubber circuit can be delivered back to the switch node when a voltage difference between a stored voltage of the capacitor and a voltage of switch node exceeds a forward (turn-on) voltage of the diode.

Because, in the approaches described herein, the RDC snubber circuit activates (snubs voltage and/or current on the switch node) when its voltage is above the breakdown voltage of the diode, efficiency losses associated with continual capacitor charging and discharging in correspondence with a switch node voltage, as in previous approaches, can be reduced. Further in the approaches described herein, implementing a diode with a breakdown voltage that is lower than a breakdown voltage to an associated LS transistor breakdown voltage allows for selection (e.g., by design) of respective breakdown voltages. Accordingly, use of the RDC snubber circuits, as described herein, to reduce overshoot and/or ringing can allow for use of LS transistors (MOSFETs) with lower breakdown voltages ($BV_{dss}$) and lower on-state resistance ($R_{dson}$). This can also reduce efficiency losses as compared to prior approaches in which transistors with higher breakdown voltages are used.

FIG. 1 is a block diagram illustrating a power converter 100 according to an implementation. The power converter 100 is shown by way of example and for purposes of illustration. In some implementations, the power converter 100 can include other elements not specifically shown, such as a control circuit and/or passive circuit elements.

In this example, the power converter 100 includes a high-side (HS) transistor 110, a LS transistor 120, a RDC snubber circuit 130 and an output circuit 140. In some implementations, the HS transistor 110 and the LS transistor can be implemented using respective power MOSFETs, such as vertical power MOSFETs that are implemented in a corresponding semiconductor device, semiconductor devices. For instance, such vertical power MOSFETs can be implemented in a semiconductor substrate (semiconductor region). A terminal 112 can be configured to receive a signal (e.g., from a power converter control circuit) for controlling the HS transistor 110. For instance, the terminal 112 can be a gate terminal of a HS power MOSFET (e.g., a conductive electrode disposed on a dielectric layer). Likewise, a terminal 122 can be configured to receive a signal (e.g., from a power converter control circuit) for controlling the LS transistor 120. For instance, the terminal 122 can be a gate terminal of a LS power MOSFET. While the RDC snubber circuit 130 of FIG. 1 is shown as being associated with the LS transistor 120, in some implementations, such an RDC snubber circuit can also be associated with the HS transistor 110.

As shown in FIG. 1, the HS transistor 110 and the LS transistor 120 are coupled with a switch node 124 of the power converter 100. For instance, in implementations of the power converter 100 including power MOSFETs, a source of the HS transistor 110 and a drain of the LS transistor 120 can be coupled with the switch node 124. Further in the example of FIG. 1, the RDC snubber circuit 130 and the output circuit 140 are coupled with the switch node 124. In some implementations, the RDC snubber circuit 130 can be implemented using the circuits and/or devices described herein. The output circuit 140 can be a circuit configured to regulate an output voltage of the power converter, and the output voltage can be provided to a corresponding circuit load on a terminal 142. In some implementations, the output circuit 140 can be an inductor-capacitor (LC) circuit.

In the power converter 100 of FIG. 1, a supply voltage can be provided to the HS transistor 110 (e.g., via a drain terminal of a HS MOSFET). In such an implementation, a diode of the RDC snubber circuit 130 can have a breakdown voltage that is greater than the supply voltage and less than breakdown voltage of the LS transistor 120. Such a configuration can provide for desired charging and discharging of a capacitor of the RDC snubber circuit 130, such as in the examples described herein.

Figure 2:
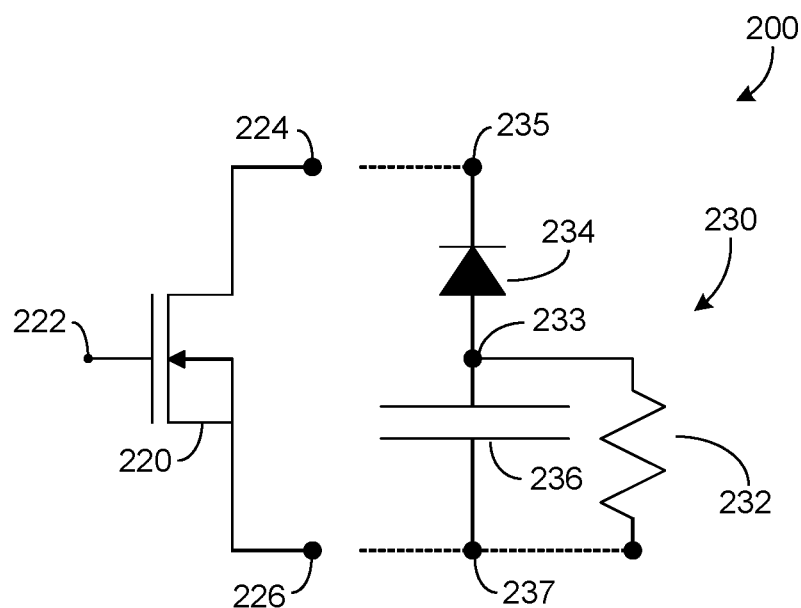
FIG. 2 is a schematic diagram illustrating a circuit illustrating a low-side (LS) transistor and integrated RDC snubber circuit that can be implemented in the power converter of FIG. 1.

FIG. 2 is a schematic diagram illustrating a circuit 200 including a LS MOSFET transistor 220 integrated with a RDC snubber circuit 230 that can be used, respectively, to implement the LS transistor 120 and the RDC snubber circuit 130 of the power converter 100 of FIG. 1. As illustrated in FIG. 2, the LS MOSFET transistor 220 includes a gate 222 (gate terminal, gate connection, etc.) a drain 224 (drain terminal, drain connection, etc.), and a source 226 (source terminal, source connection, etc.). In some implementations, the LS MOSFET transistor 220 can be a vertical power MOSFET implemented in a semiconductor region and/or a semiconductor substrate (hereafter "semiconductor region"), where the drain 224 is included in the semiconductor region (e.g., a backside drain), while connections to the gate 222 and the source 226 are provided, e.g., through metallization, on a front side (top side) of the semiconductor region. In this example, the drain 224 can be coupled with a switch node of an associated power converter, e.g., the switch node 124 of FIG. 1, and the source 226 can be coupled with an electrical ground.

As shown in FIG. 2, the RDC snubber circuit 230 includes a resistor 232, a diode 234, and a capacitor 236. In the RDC snubber circuit 230, an anode of the diode 234 is coupled with a node 233, while a cathode of the diode 234 is coupled with a node 235. Also in the RDC snubber circuit 230, a first terminal of the capacitor 236 is coupled with the node 233, or with the anode of the diode 234, while a second terminal of the capacitor 236 is coupled with a node 237. While the capacitor 236 is shown as a single capacitor in FIG. 2, in some implementations the capacitor 236 can represent a lumped capacitance, e.g., where the capacitor 236 is implemented using multiple capacitors coupled in parallel with each other, such as in the examples of FIGS. 7, 9 and 11A-11B. The resistor 232 of the RDC snubber circuit 230 is coupled between the node 233 (the anode of the diode 234) and the node 237 (the second terminal of the capacitor 236). As further shown in FIG. 2, the RDC snubber circuit 230 can be integrated with the LS MOSFET transistor 220 by coupling the node 235 with the drain 224 of the LS MOSFET transistor 220 (e.g., to a switch node of a power converter), and coupling the node 237 with the source 226 of the LS MOSFET transistor 220 (e.g., to electrical ground).

In implementations, the LS MOSFET transistor 220 and the diode 234 can be designed and/or produced such that BVdss of the LS MOSFET transistor 220 is greater than a breakdown voltage ($BV_{diode}$) of the diode 234. Accordingly, when implemented in a power converter, such as the power converter 100, the RDC snubber circuit 230 can operate such that it activates (e.g., snubs voltage and/or current on the switch node by charging the capacitor 236) to prevent overshoot and/or ringing when a voltage of a corresponding switch node voltage exceeds $BV_{diode}$. When the voltage on the switch node is below $BV_{diode}$, the resistor 232 can discharge the capacitor 236, and/or can prevent charging of the capacitor 236 by conducting leakage current of the diode 234. Further, when a voltage difference between a voltage stored on the capacitor 236 and a voltage on the switch node is greater than a forward voltage of the diode 234, charge stored on the capacitor 236 can be delivered back to the switch node. As discussed above, such operation of the RDC snubber circuit 230 can reduce power conversion efficiency losses in an associated power converter, as compared to previous approaches.

Figure 3:
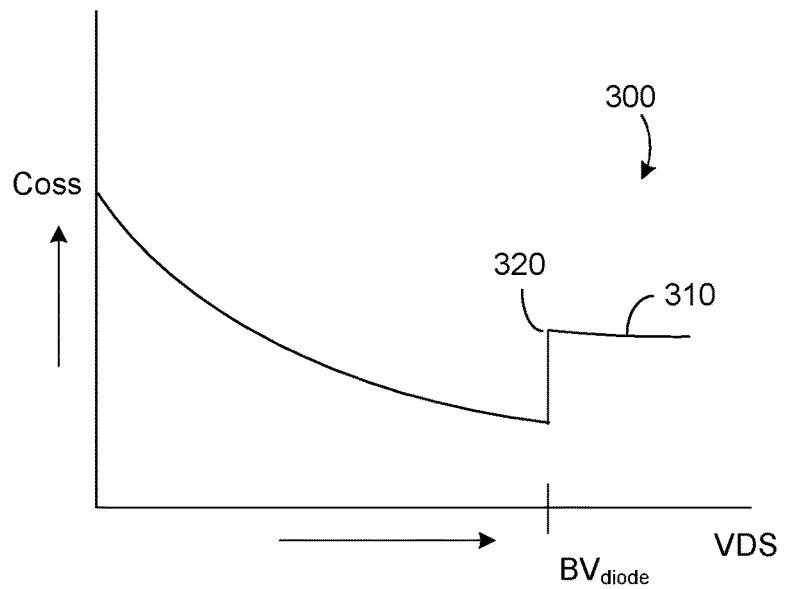
FIG. 3 is a graph schematically illustrating output capacitance of a power converter including an implementation of the RDC snubber circuit of FIG. 2.

FIG. 3 is a graph 300 schematically illustrating output capacitance of a power converter including an implementation of the RDC snubber circuit 230 of FIG. 2, e.g., an implementation of the power converter 100, where the RDC snubber circuit 230 is used to implement the RDC snubber circuit 130. Accordingly, for purpose of illustration, the graph 300 will be described with further reference to FIGS. 1 and 2. In FIG. 3, trace 310 illustrates, on the y-axis, output capacitance ($C_{oss}$) (combined capacitance of a LS MOSFET and a RDC snubber circuit on a switch node) as a function of drain-to-source voltage (VDS), on the x-axis, of the LS MOSFET. As shown by the trace 310, when $V_{DS}$ of the LS MOSFET transistor 220 (a voltage on switch node 124) increases to a voltage that is greater than or equal to $BV_{diode}$ of the diode 234, the RDC snubber circuit 230 activates, as is shown by the step increase 320 in $C_{oss}$ shown by the trace 310. This step increase 320 is a result of breakdown of the diode 234 causing the capacitor 236 to contribute to $C_{oss}$. Accordingly, in such implementations, snubbing is inactive when VDS is below $BV_{diode}$ and active when VDS is at or above $BV_{diode}$.

Figure 4:
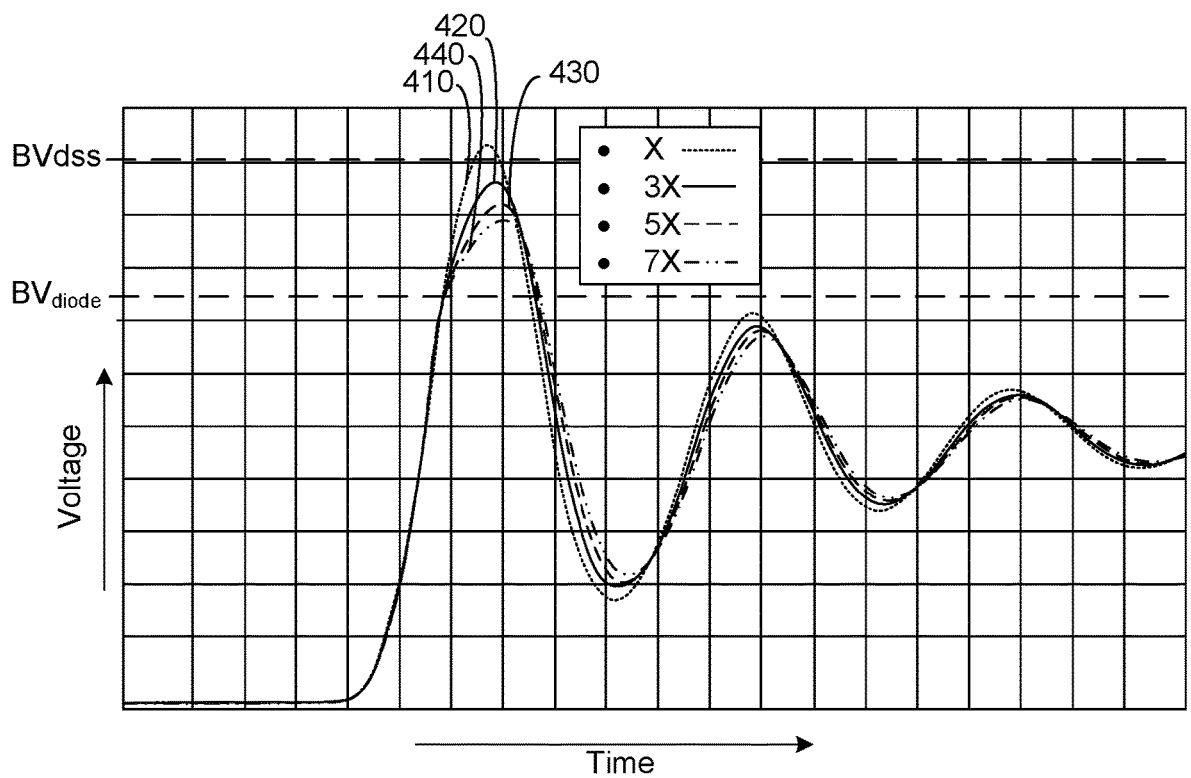
FIG. 4 is a is a graph illustrating the effect of capacitance on operation of implementations of the RDC snubber circuit of FIG. 2.

FIG. 4 is a graph 400 illustrating the effect of capacitance (e.g., capacitance value) on operation of implementations of the RDC snubber circuit 230 of FIG. 2, e.g., when implemented in a power converter, such as the power converter 100. Accordingly, as with the discussion of the graph 300, the graph 400 will be described with further reference to FIGS. 1 and 2. In the graph 400, respective voltage traces as a function of operating time of the power converter 100 for a range of arbitrary capacitance values of the capacitor 236 with a fixed $BV_{diode}$ of the diode 234 are shown. Specifically, a trace 410 illustrates switch node voltage for a capacitance value of X, a trace 420 illustrates switch node voltage for a capacitance value of 3×, a trace 430 illustrates switch node voltage for a capacitance value of 5×, and a trace 440 illustrates switch node voltage for a capacitance value of 7×. The specific values of time, capacitance and $BV_{diode}$ can vary, and will depend on the particular implementation.

As shown by FIG. 4, respective change in slopes of the traces 410-440 occur when the respective switch node voltages are greater than or equal to $BV_{diode}$ of the diode 234, which is fixed in this example. This change in slope indicates that breakdown of the diode 234 has occurred and snubbing of voltage (and/or current) on the switch node 124 by the RDC snubber circuit 230 is active, e.g., that a step increase in $C_{oss}$ corresponding with the capacitor 236 has occurred. As is also shown in FIG. 4, when the switch node voltage is below $BV_{diode}$ and snubbing by the RDC snubber circuit 230 is inactive, the traces 410-440 have a same slope, due to the capacitor 236 being isolated from the switch node 124 by the diode 234. However, when the switch node voltage is at or above $BV_{diode}$ and snubbing by the RDC snubber circuit 230 is active, the slopes of the traces 410-440, as well as their peak voltages vary as a function of the respective capacitance value of the capacitor 236. Specifically, as is shown by the traces 410-440, as a capacitance value of the capacitor 236 increases, slope and peak voltage decrease. Accordingly, for an implementation of the RDC snubber circuit 230 with a given $BV_{dss}$ of the LS MOSFET transistor 220 and a given $BV_{diode}$ of the diode 234, a value for the capacitor 236 can be selected (by design) to achieve switch node voltage characteristic that reduce overshoot and/or ringing, so as to prevent power efficiency losses and/or prevent damage to the LS MOSFET transistor 220.

FIG. 5 is a graph illustrating the effect of $BV_{diode}$ on operation of implementations of the RDC snubber circuit 230 of FIG. 2, e.g., when implemented in a power converter, such as the power converter 100. Accordingly, as with the discussions of the graph 300 and the graph 400, the graph 500 will be described with further reference to FIGS. 1 and 2. In the graph 500, respective voltage traces as a function of operating time of the power converter 100 for a range of arbitrary $BV_{diode}$ values of the diode 234 with a fixed capacitance value of the capacitor 236 are shown. Specifically, a trace 510 illustrates switch node voltage for a $BV_{diode}$ value of Y, a trace 520 illustrates switch node voltage for a $BV_{diode}$ value of 1.5Y, a trace 530 illustrates switch node voltage for a $BV_{diode}$ value of 2Y, and a trace 540 illustrates switch node voltage for a $BV_{diode}$ value of 2.5Y. The specific values of time, capacitance and $BV_{diode}$ can vary, and will depend on the particular implementation.

As shown by FIG. 5, changes in slopes of the traces 510-540 occur when the respective switch node voltages are greater than or equal to the respective $BV_{diode}$ values of the diode 234. This change in slope indicates that breakdown of the diode 234 has occurred and snubbing of voltage (and/or current) on the switch node 124 by the RDC snubber circuit 230 is active, e.g., that a step increase in $C_{oss}$ corresponding with the capacitor 236 has occurred. As is also shown in FIG. 5, when the switch node voltages are below $BV_{diode}$ and snubbing by the RDC snubber circuit 230 is inactive, the traces 510-540 have a same slope, due to the capacitor 236 being isolated from the switch node 124 by the diode 234. As is shown by the traces 510-540, as $BV_{diode}$ of the diode 234 increases, a voltage at which snubbing by the RDC snubber circuit 230 is activated increases. Accordingly, for an implementation of the RDC snubber circuit 230 with a given $BV_{dss}$ of the LS MOSFET transistor 220 and a given capacitance value of the capacitor 236, $BV_{diode}$ for the diode 234 can be selected (by design) to achieve switch node voltage characteristic that reduce overshoot and/or ringing.

FIGS. 6 to 13 illustrate examples of diodes, capacitors and/or resistors that can be used to implement, in one or more semiconductor devices, a RDC snubber circuit, such as the RDC snubber circuit 230 of FIG. 2. That is, in some implementations, diodes, capacitors and resistors, such as those shown in FIGS. 6 to 13, can be interconnected to produce a RDC snubber circuit. In some implementations, the diodes, capacitors and resistors of FIGS. 6 to 13 can be implemented in conjunction with a LS MOSFET, or other transistor device to produce an integrated transistor and RDC snubber circuit, such as implementations of the circuit 200 of FIG. 2. In FIGS. 6 to 13, respective portions of example structures are shown for purposes of illustration. In some implementations, the structures shown in FIGS. 6 to 13 (e.g., cross-sectional views) can extend into and out of the page, e.g., to create structures of a desired size. Also, the structures shown in FIGS. 6 to 13 be extended, mirrored and/or replicated on their left/and or their right to produce larger structures (devices).

While FIGS. 6 to 13 are discussed further below, briefly, FIGS. 6 to 10 illustrate respective examples of combined diodes and capacitors that can be implemented in a semiconductor device as part of a RDC snubber circuit. In some implementations, the diodes and capacitors of the structures of FIGS. 6 to 11 can be implemented separately from one another, and then appropriately interconnected. FIGS. 11A and 11B illustrate an example of a metal-insulator-metal (MIM) capacitor that can be included in a RDC snubber circuit, while FIGS. 12A, 12B and 13 illustrate example resistors that can be included in a RDC snubber circuit.

Figure 14:
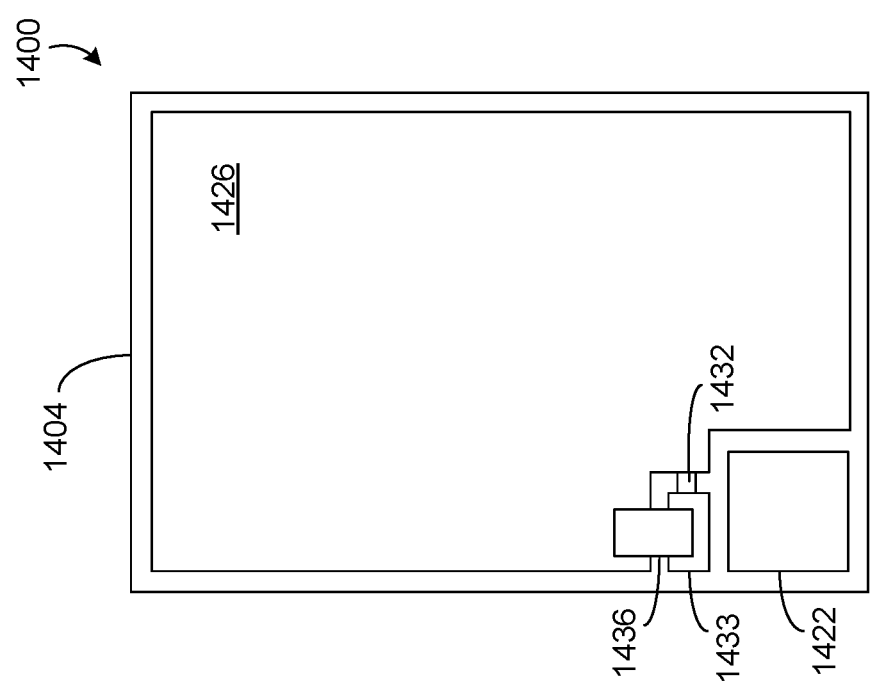
FIG. 14 is a diagram illustrating an implementation of a MOSFET and RDC snubber circuit.

In some implementations at least one of the capacitor, diode and/or resistor of a RDC snubber circuit can be implemented as a discrete element (e.g., a surface-mounted capacitor such as shown in FIG. 14) that is coupled with a semiconductor device including other circuit elements to produce an integrated transistor and RDC snubber circuit. In some implementations, an integrated transistor and RDC snubber circuit can be implemented using a first semiconductor die including a transistor, such as a LS MOSFET, and second semiconductor die including a RDC snubber circuit, such as the RDC snubber circuit 230. In such implementations, the first semiconductor die and the second semiconductor die can be included, and interconnected, in a single semiconductor device package, such as the example of FIG. 15.

Operating characteristics of the capacitors, diodes and resistors in the examples of FIGS. 6 to 13 can be determined by design and/or process. That is, respective capacitance values, $BV_{diode}$ values and resistance values appropriate for a particular implementation can be achieved through layout and sizing, as well as through selection of semiconductor processing parameters, such as doping concentrations, and or material. While specific examples are shown in FIGS. 6 to 13, in some implementations, other capacitors, diode and/or resistor implementations can be used. For instance, as some example, diodes can be implemented as Zener diodes, resistors can be implemented as diffusion resistors or metal resistors, and capacitors can be implemented using low-k and/or high-k dielectrics to achieve a desired capacitance value.

FIG. 6 is a diagram illustrating a cross-sectional view of an integrated diode and capacitor 600 that can be included in a RDC snubber circuit. For instance, the integrated diode and capacitor 600 can implement the diode 234 and the capacitor 236 of the RDC snubber circuit 230 in an implementation of the circuit 200. The integrated diode and capacitor 600, as shown in FIG. 6, includes a p-type region 602, a n-type region 604, a dielectric 606 and a metal layer 608. In this example, a diode 634 of the integrated diode and capacitor 600 includes the p-type region 602 and the n-type region 604, where the p-type region 602 defines (includes, acts as, etc.) an anode of the diode 634, while the n-type region 604 defines (includes, acts as, etc.) a cathode of the diode 634.

Also in this example, a capacitor 636 of the integrated diode and capacitor 600 includes the p-type region 602, the dielectric 606 and the metal layer 608. The p-type region 602, which can be a heavily-doped p-type region, defines (includes, acts as, etc.) a first terminal or plate of the capacitor 636, while the metal layer 608 defines (includes, acts as, etc.) a second terminal of the capacitor 636, with the dielectric 606 acting as the dielectric of the capacitor 636.

In this example, the p-type region 602 can be disposed in the n-type region 604, where the n-type region is a n-type semiconductor region, such as an epitaxial semiconductor layer and/or semiconductor substrate. The n-type region 604 can be a lightly-doped n-type region, a heavily doped n-type region, or a combination thereof. When included in implementations of the circuit 200, the n-type region 604 can also define (include, act as, etc.) a drain of an associated LS MOSFET transistor that is included in the semiconductor region, while the metal layer 608 can be coupled with a source of the LS MOSFET. That is, in such implementations, the metal layer 608 can be referred to as being source metal.

FIG. 7 is a diagram illustrating a cross-sectional view of an integrated diode and parallel capacitors 700 that can be included in a RDC snubber circuit. For instance, the integrated diode and parallel capacitors 700 can implement the diode 234 and the capacitor 236 of the RDC snubber circuit 230 in an implementation of the circuit 200. The integrated diode and parallel capacitors 700, as shown in FIG. 7, includes a p-type region 702, a n-type region 704, a dielectric 706, a metal layer 708, and an electrode 709 disposed within the dielectric 706. In this example, as with the integrated diode and capacitor 600, a diode 734 of the integrated diode and parallel capacitors 700 includes the p-type region 702 and the n-type region 704, where the p-type region 702 defines (includes, acts as, etc.) an anode of the diode 734, while the n-type region 704 defines (includes, acts as, etc.) a cathode of the diode 734. The p-type region 702 can be a heavily-doped p-type region. The n-type region 704 can be a lightly-doped n-type region, a heavily doped n-type region, or a combination thereof.

Also in this example, parallel capacitors 736 of the integrated diode and parallel capacitors 700 includes the p-type region 702, the dielectric 706, the metal layer 708, and the electrode 709. The p-type region 702, which can be a heavily-doped p-type region, defines (includes, acts as, etc.) a first terminal or plate of a first capacitor of the parallel capacitors 736, while the metal layer 708 defines (includes, acts as, etc.) a first terminal or plate of a second capacitor of the parallel capacitors 736. In this example, the electrode 709, which can be a doped polysilicon electrode, can define (include, act as, etc.) a second terminal or plate of both the first capacitor and the second capacitor, while the dielectric 706 acts as the dielectric for both parallel capacitors. As shown in FIG. 7, the metal layer 708 can contact the p-type region 702, such that the metal layer 708 is coupled with the anode of the diode 734. The parallel capacitors 736, as compared to the capacitor 636, can increase capacitance density (capacitance per unit of semiconductor region area associated with the parallel capacitors 736), which can allow for using less semiconductor region area to achieve a given capacitance value.

In this example, as with the integrated diode and capacitor 600, the p-type region 702 can be disposed in the n-type region 704, where the n-type region is a semiconductor region, such as an epitaxial semiconductor layer and/or semiconductor substrate. When included in implementations of the circuit 200, the n-type region 704 can also define (include, act as, etc.) a drain of an associated LS MOSFET transistor that is included in the semiconductor region, while the electrode 709 can be coupled with a source of the LS MOSFET. That is, in such implementations, the electrode 709 can be referred to as being source polysilicon.

Figure 8:
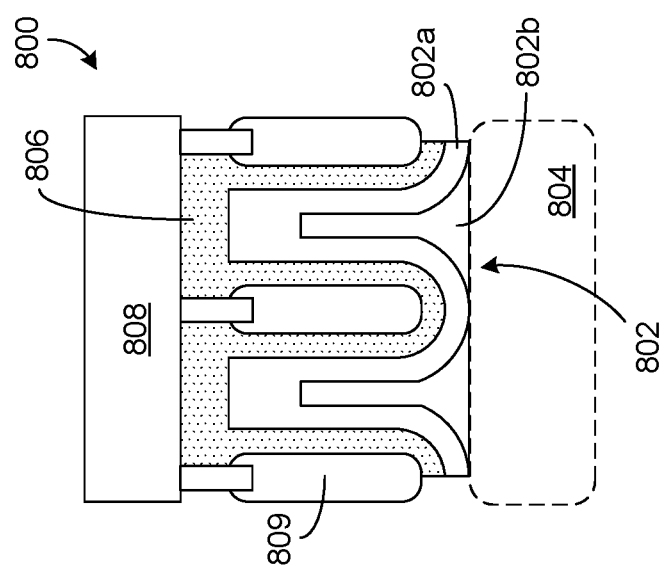
FIG. 8 is a diagram illustrating a cross-sectional view of an integrated diode and trench capacitor that can be included in a RDC snubber circuit.

FIG. 8 is a diagram illustrating a cross-sectional view of an integrated diode and trench capacitor 800 that can be included in a RDC snubber circuit. For instance, the integrated diode and trench capacitor 800 can implement the diode 234 and the capacitor 236 of the RDC snubber circuit 230 in an implementation of the circuit 200. The integrated diode and trench capacitor 800, as shown in FIG. 8, includes a p-type region 802 having a heavily doped p-type region 802a, and a lightly doped p-type region 802b. The integrated diode and trench capacitor 800 also includes a n-type region 804, a dielectric 806, a metal layer 808, and trench electrodes 809. The trench electrodes 809 can be doped polysilicon electrodes that are disposed in respective trenches that are lined with the dielectric 806. In this example, a diode of the integrated diode and trench capacitor 800 includes the p-type region 802, and the n-type region 804, where the p-type region 802 defines (includes, acts as, etc.) an anode of the diode, while the n-type region 804 defines (includes, acts as, etc.) a cathode of the diode. As shown in FIG. 8, the p-type region 802 can be disposed in mesas of the semiconductor region between the dielectric-lined trenches, and below (in the orientation of FIG. 8) the dielectric-lined trenches including the trench electrodes 809. The n-type region 804 can be a lightly-doped n-type region, a heavily doped n-type region, or a combination thereof.

Also in this example, a capacitor of the integrated diode and trench capacitor 800 includes the p-type region 802, the dielectric 806, and the trench electrodes 809. The p-type region 802 defines (includes, acts as, etc.) a first terminal or plate of the capacitor, while the trench electrodes 809 define (include, act as, etc.) a second terminal of the capacitor, with the dielectric 806 acting as the dielectric of the capacitor 836. The use of trench electrodes 809 in the capacitor of FIG. 8 (as well as the trench capacitors of FIG. 9), as compared to planar capacitors such as those shown in FIGS. 6 and 7, can increase capacitance density (capacitance per unit of semiconductor region area associated with the trench capacitor), which can allow for using less semiconductor region area to achieve a given capacitance value.

In this example, the p-type region 802 can be disposed in the n-type region 804, such as described above, where the n-type region is a n-type semiconductor region, such as an epitaxial semiconductor layer and/or semiconductor substrate. When included in implementations of the circuit 200, the n-type region 804 can also define (include, act as, etc.) a drain of an associated LS MOSFET transistor that is included in the semiconductor region. The metal layer 808 can be coupled with a source of the LS MOSFET, and contacted to the trench electrodes 809 to couple the trench electrodes 809 to source potential, such as in the arrangement of the capacitor 236 in the circuit 200. That is, in such implementations, the metal layer 808 can be referred to as being source metal.

Figure 9:
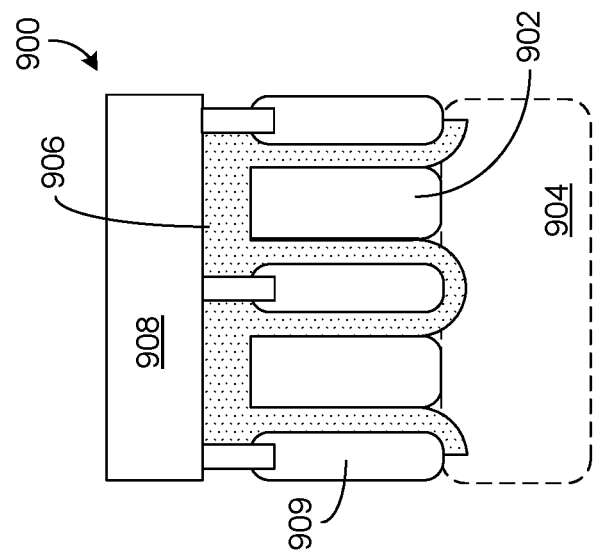
FIG. 9 is a diagram illustrating a cross-sectional view of another integrated diode and trench capacitor that can be included in a RDC snubber circuit.

FIG. 9 is a diagram illustrating a cross-sectional view of another integrated diode and trench capacitor 900 that can be included in a RDC snubber circuit. The integrated diode and trench capacitor 900 is a modification of the integrated diode and trench capacitor 800 of FIG. 8. In FIG. 9, elements of the integrated diode and trench capacitor 900 are referenced with 900 series numbers corresponding with the 800 series numbers of their like elements in FIG. 8. For instance, the integrated diode and trench capacitor 900 includes a p-type region 902, a n-type region 904, a dielectric 906, a metal layer 908, and trench electrodes 909. For purposes of brevity, like aspects of these elements with those in FIG. 8 are not described in detail again herein, with differences between the integrated diode and trench capacitor 800 and the integrated diode and trench capacitor 900 being discussed below.

As illustrated in FIG. 9, the p-type region 902, as compared with the multiple portions of the p-type region 802 of FIG. 8, includes a single portion, which can be a heavily doped p-type region. Also, as compared with the p-type region 802, the p-type region 902 is not disposed below the dielectric-lined trenches in which the trench electrodes 909 are disposed. In this arrangement, when implemented in a semiconductor device with a corresponding LS MOSFET, the lower portions of the trench electrodes 909 can provide drain-to-source capacitance (e.g., between the metal layer 908 and the n-type region 904) for the LS MOSFET. This additional capacitance can be adjusted, by design, to further adjust switching operation (e.g., switch node voltage characteristics) in a corresponding power converter.

Figure 10:
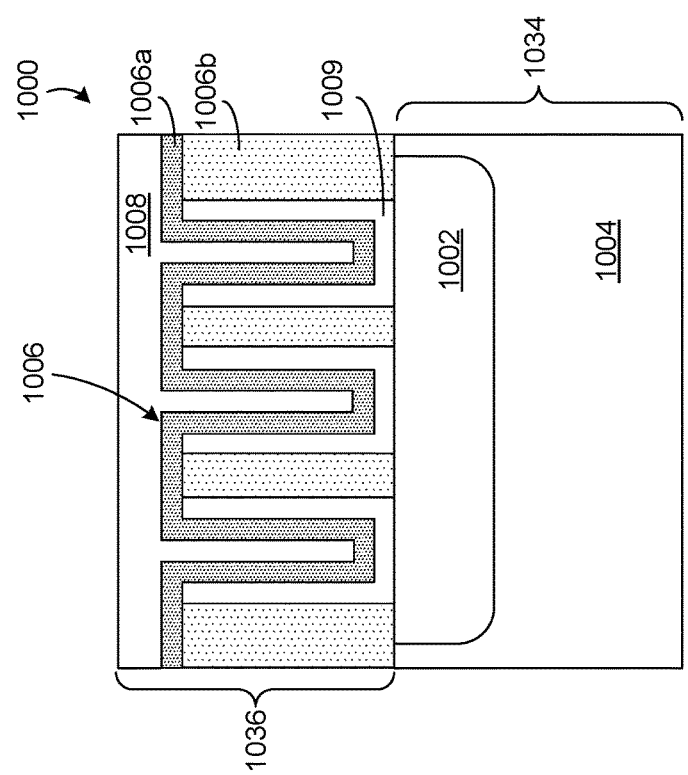
FIG. 10 is a diagram illustrating an integrated diode and metal-insulator-metal (MIM) capacitor that can be included in a RDC snubber circuit.

FIG. 10 is a diagram illustrating an integrated diode and metal-insulator-metal (MIM) capacitor 1000 that can be included in a RDC snubber circuit. For instance, the integrated diode and MIM capacitor 1000 can implement the diode 234 and the capacitor 236 of the RDC snubber circuit 230 in an implementation of the circuit 200. The integrated diode and MIM capacitor 1000, as shown in FIG. 10, includes a p-type region 1002, a n-type region 1004, a dielectric 1006 (including portions 1006a and 1006b), a metal layer 1008 and a metal layer 1009. In the integrated diode and MIM capacitor 1000, the metal layer 1009 is patterned to include multiple portions. In some implementations, the metal layer 1009 can be a continuous metal layer. In this example, a diode 1034 of the integrated diode and MIM capacitor 1000 includes the p-type region 1002 and the n-type region 1004, where the p-type region 1002 defines (includes, acts as, etc.) an anode of the diode 1034, while the n-type region 1004 defines (includes, acts as, etc.) a cathode of the diode 1034.

Also in this example, a MIM capacitor 1036 of the integrated diode and MIM capacitor 1000 includes the metal layer 1008, the dielectric 1006 and the metal layer 1009. The metal layer 1009, which is contacted to the p-type region 1002 (e.g., the anode of the diode 1034) defines (includes, acts as, etc.) a first terminal or plate of the MIM capacitor 1036, while the metal layer 1008 defines (includes, acts as, etc.) a second terminal or plate of the MIM capacitor 1036, with the dielectric 1006 acting as the dielectric of the MIM capacitor 1036. As shown in FIG. 10, the dielectric 1006, the metal layer 1008, and the metal layer 1009 can be configured (patterned), such that the MIM capacitor 1036 is formed as a vertical, serpentine-shaped MIM capacitor. Such a serpentine shaped, as compared to planar capacitors such as in FIGS. 6 and 7, can increase capacitance density (capacitance per unit of semiconductor region area associated with the MIM capacitor 1036), which can allow for using less semiconductor region area to produce a capacitor of a given capacitance value.

In this example, the p-type region 1002 can be disposed in the n-type region 1004, where the n-type region is a n-type semiconductor region, such as an epitaxial semiconductor layer and/or semiconductor substrate. The n-type region 1004 can be a lightly-doped n-type region, a heavily doped n-type region, or a combination thereof. When included in implementations of the circuit 200, the n-type region 1004 can also define (include, act as, etc.) a drain of an associated LS MOSFET transistor that is included in the semiconductor region, while the metal layer 1008 can be coupled with a source of the LS MOSFET. That is, in such implementations, the metal layer 1008 can be referred to as being source metal.

Figure 11A:
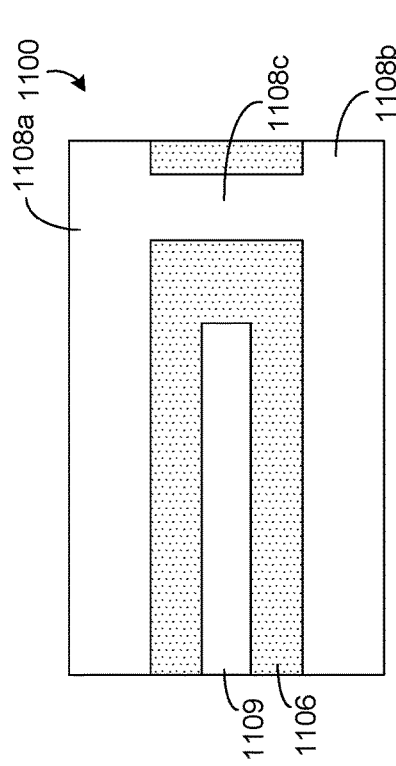
FIG. 11A is a cross-sectional view of a MIM capacitor that can be included in a RDC snubber circuit
Figure 11B:
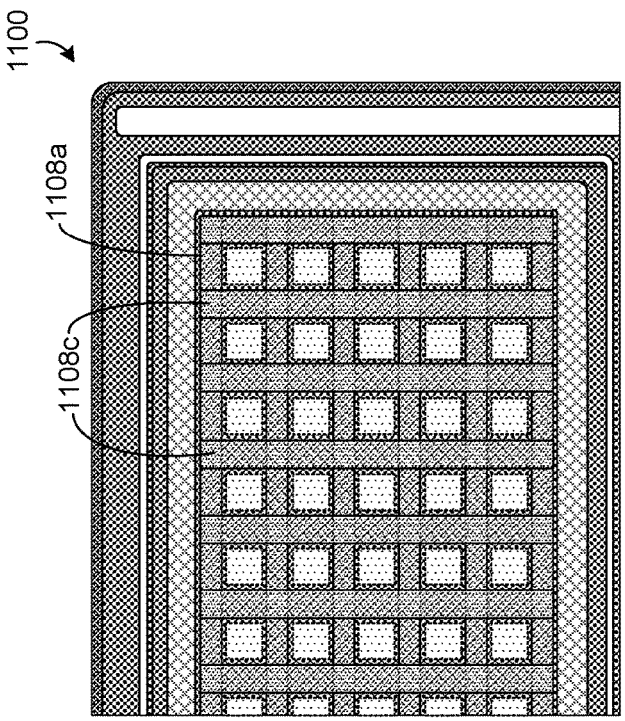
FIG. 11B is a diagram illustrating a top (plan) view of the MIM capacitor of FIG. 11A.

FIG. 11A is a cross-sectional view of a MIM capacitor 1100 (which implements parallel capacitors) that can be included in a RDC snubber circuit. For instance, the MIM capacitor 1100 can implement the capacitor 236 of the RDC snubber circuit 230 in an implementation of the circuit 200. FIG. 11B is a diagram illustrating a top (plan) view of an implementation of the MIM capacitor 1100 of FIG. 11A. Such as was noted above, FIGS. 11A and 11B illustrate portions of a MIM capacitor to show the structure of the example MIM capacitor 1136. In example implementations, the structure of the MIM capacitor 1136 shown in FIGS. 11A and 11B can be extended, replicated and/or mirrored to produce a MIM capacitor.

As shown in FIGS. 11A and 11B, the MIM capacitor 1100, includes a metal layer 1108a, a metal layer 1108b, vias 1108c, a dielectric 1106, and an electrode 1109 that is disposed within the dielectric 1106. In some implementations, the metal layer 1108a, the metal layer 1108b and the vias 1108c can be coupled with a source of an associated LS MOSFET, such as in the circuit 200, which can allow the MIM capacitor 1136 to be disposed on an active area of the LS MOSFET. Such an approach can conserve semiconductor die area, as semiconductor die area occupied by the MIM capacitor 1136 is also occupied by the LS MOSFET. That is, the MIM capacitor 1136 may not occupy dedicated semiconductor die area. Likewise, the integrated diode and capacitor structures of FIGS. 6-11 can similarly conserve semiconductor die area.

In this example, the metal layer 1108a defines (includes, acts as, etc.) a first terminal or plate of a first capacitor of the parallel capacitors, while the metal layer 1108b defines (includes, acts as, etc.) a first terminal or plate of a second capacitor of the parallel capacitors. In this example, the electrode 1109 can define (include, act as, etc.) a second terminal or plate of both the first capacitor and the second capacitor, while the dielectric 1106 acts as the dielectric for both parallel capacitors. In some implementations, a thickness of the dielectric 1106 above the electrode 1109 can be different than a thickness of the dielectric 1106 below the electrode 1109. In some implementations, different dielectric materials can be included in the dielectric 1106. The electrode 1109 can be a metal electrode or a doped-polysilicon electrode that is coupled to an anode of an associated diode, e.g., the anode of the diode 234 in FIG. 2. As shown in FIG. 11A, the metal layer 1108a (e.g., a top metal layer of the MIM capacitor 1100) can be lattice-shaped, and be contacted (e.g., at intersections of the lattice) with the metal layer 1108b (not visible in FIG. 11B) using the vias 1108c. In example implementations, the metal layer 1108b can also be lattice-shaped, such as in vertical correspondence with the metal layer 1108a. That is, the metal layer 1108b be of a same arrangements as the metal layer 1108a, and vertically aligned with the metal layer 1108a. In other implementations, the metal layer 1108a and/or the metal layer 1108b can be continuous metal plates that are periodically contacted using the vias 1108c.

FIG. 12A is a cross-sectional view of a trench resistor 1200 that can be included in a RDC snubber circuit, such as to implement the resistor 232 of the circuit 200. FIG. 12B is another cross-sectional view of the trench resistor 1200 of FIG. 12A. In this example, the cross-sectional view of the trench resistor 1200 in FIG. 12A is taken along a section line 12A-12A in FIG. 12B, while the cross-section view of the trench resistor 1200 in FIG. 12B is taken along a section line 12B-12B in FIG. 12A. Such as was noted above, the trench resistor 1200, as shown in FIGS. 12A and 12B can extend in out of the page, and/or can be extended to the left and/or right to produce a resistor of a desired resistance value. In some implementation, a desired resistance can be achieved by modifying a width of the trench 1202, a length of the trench 1202, and/or a number of trenches used to implement a resistor.

As shown in FIGS. 12A and 12B, the trench resistor 1200 can include a resistive element 1232 that is disposed in a trench 1202. In this example, the trench 1202 is lined with a dielectric 1206, and the resistive element 1232 is disposed in the dielectric 1206. In some implementations, the resistive element 1232 can include doped polysilicon, metal, or other resistive material. In some implementations, the resistive element 1232 can be implemented using a diffusion resistive element. As illustrated in FIG. 12B, the resistor can include a contact 1208 at a first end of the resistive element 1232, and a contact 1209 at a second end of the resistive element 1232. The contacts 1208 and 1209 are not specifically shown in FIG. 12A. When included an implementation of the circuit 200, e.g., as the resistor 232, the contact 1208 can be coupled with an anode of the diode 234, while the contact 1209 can be coupled with a source of the LS MOSFET transistor 220. In some implementations, these contacts can be reversed.

FIG. 13 is a cross-sectional view of a planar resistor 1300 that can be included in a RDC snubber circuit, such as to implement the resistor 232 of the circuit 200. Such as was noted above with respect to the trench resistor 1200, the planar resistor 1300, as shown in FIG. 113, can extend in out of the page, and or can be extended to the left and/or right to produce a resistor of a desired resistance value. As shown in FIG. 13, the planar resistor 1300 includes a resistive element 1332, a substrate 1306, a dielectric 1306a, a dielectric 1307, a contact 1308, and a contact 1309. As with the resistive element 1232, the resistive element 1332 can include doped polysilicon, metal, or other resistive material. As shown in FIG. 13, the contact 1308 can contact the resistive element 1332 at a first end, and the contact 1309 can contact the resistive element 1332 at a second end. The resistive element 1332 can be disposed on the dielectric 1306a, which is in turn disposed on the substrate 1306. When included an implementation of the circuit 200, e.g., as the resistor 232, the contact 1308 can be coupled with an anode of the diode 234, while the contact 1309 can be coupled with a source of the LS MOSFET transistor 220. In some implementations, these contacts can be reversed.

FIG. 14 is a diagram illustrating an implementation of a MOSFET and RDC snubber circuit (circuit 1400), which can be used to implement the circuit 200 of FIG. 2. As shown in FIG. 14, the circuit 1400 includes a semiconductor region 1404 (substrate), which can include a lightly-doped n-type semiconductor region, a heavily-doped n-type semiconductor region, or combinations thereof. For instance, the semiconductor region 1404 can include a lightly-doped, e.g., epitaxial, semiconductor layer disposed on a heavily doped semiconductor layer. The circuit 1400 includes a gate connection pad 1422 and source metal 1426. The gate connection pad 1422 can be coupled with a gate terminal of a MOSFET, e.g., the LS MOSFET 220, included in the semiconductor region 1404, while the source metal 1426 can be coupled with a source terminal of the MOSFET. A drain terminal connection for the MOSFET can be included on a bottom side of the semiconductor region 1404, which is not visible in FIG. 14.

In this example, the circuit 1400 also includes an anode connection pad 1433 that can be coupled to an anode of a diode included in the semiconductor region 1404. For instance, the diode can be disposed under the anode connection pad 1433, and implemented using a diode such as those described herein with respect to, e.g., at least FIGS. 6 and 7. As further shown in FIG. 14, a resistor 1432 can be coupled between the anode connection pad 1433 and the source metal 1426. The circuit 1400 further includes a surface-mount cap 1436 that is disposed on the semiconductor region 1404 and coupled with the anode connection pad 1433 and the source metal 1426 using, e.g., solder, sinter, and/or a conductive adhesive to provide a snubbing capacitance for the circuit 1400 (e.g., the capacitor 236 of the circuit 200).

Figure 15:
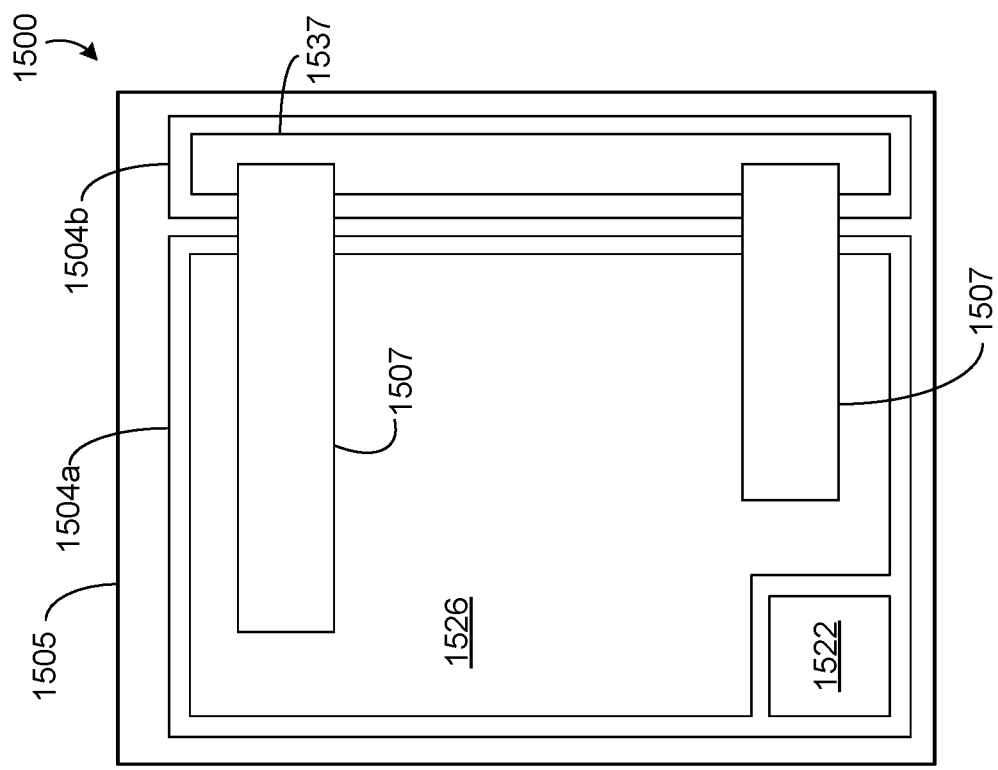
FIG. 15 is a diagram illustrating another implementation of a MOSFET and RDC snubber circuit.

FIG. 15 is a diagram illustrating another implementation of a MOSFET and RDC snubber circuit (circuit 1500), which can be used to implement the circuit 200 of FIG. 2. As shown in FIG. 15, the circuit 1500 can include a semiconductor die 1504*a* and a semiconductor die 1504*b*. The semiconductor die 1504*a* and the semiconductor die 1504*b* can each include a lightly-doped n-type semiconductor region, a heavily-doped n-type semiconductor region, or combinations thereof. For instance, the semiconductor die 1504*a* and the semiconductor die 1504*b* can each include a lightly-doped, e.g., epitaxial, semiconductor layer disposed on a heavily doped semiconductor layer.

In this example, the semiconductor die 1504*a* can include a MOSFET, such as the LS MOSFET transistor 220 of the circuit 200, while the semiconductor die 1504*b* can include a RDC snubber circuit, such as the RDC snubber circuit 230. As shown in FIG. 15, the semiconductor die 1504*a* includes a gate connection pad 1522 and source metal 1526. The gate connection pad 1522 can be coupled with a gate terminal of the LS MOSFET, while the source metal 1526 can be coupled with a source terminal of the LS MOSFET. A drain terminal connection for the MOSFET can be included on a bottom side of the semiconductor die 1504*a*, which is not visible in FIG. 15.

In the circuit 1500, the semiconductor die 1504*b* can include a RDC snubber circuit, such as the RDC snubber circuit 230 of the circuit 200. The semiconductor die 1504*b* can include a connection pad 1537, which is coupled to a capacitor (or parallel-connected capacitors) and a resistor of the RDC snubber circuit, such as the node 237 in the circuit 200 of FIG. 2. A connection to the cathode of the diode of the RDC snubber circuit (e.g., the node 235 of the circuit 200) can be included on a bottom side of the semiconductor die 1504*b*, which is not visible in FIG. 15. The semiconductor die 1504*a* and the semiconductor die 1504*b* can be coupled to a die attach paddle 1505, where the die attach paddle 1505 couples the bottom side of the semiconductor die 1504*a* with bottom side of the semiconductor die 1504*b*. For instance, in an implementation of the circuit 200 with the circuit 1500, the die attach paddle 1505 couples the drain 224 of the LS MOSFET 220 with the node 235 (e.g., with the cathode of the diode 234).

The circuit 1500 can also include at least one electrical connector 1507 that is used to couple the source metal 1526 with the connection pad 1537. That is, in an implementation of the circuit 200 with the circuit 1500, the electrical connectors 1507 couple the source 226 of the LS MOSFET 220 with the node 237 (e.g., couple the source 226 of the LS MOSFET transistor 220 with the resistor 232 and the capacitor 236, such as shown in FIG. 2). In some implementations, the circuit 1500 can be included in a semiconductor device package, such as using an epoxy molding compound, or other protective structure to protect the circuit 1500.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. As used herein, coupled to, or coupled with can refer to being electrically coupled to, electrically coupled with, physically coupled to, and/or physically coupled with.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A circuit comprising:
a metal-oxide semiconductor field-effect transistor (MOSFET) including a gate, a source, and a drain; and
a snubber circuit coupled between the drain and the source, the snubber circuit including:
a diode having a cathode and an anode, the cathode being coupled with the drain;
a capacitor having a first terminal coupled with the anode, and a second terminal coupled with the source; and
a resistor having a first terminal coupled with the anode and the first terminal of the capacitor, and a second terminal coupled with the source.

2. The circuit of claim 1, wherein a breakdown voltage of the diode is less than a breakdown of the MOSFET, the snubber circuit being configured to:
charge the capacitor when a voltage on the drain exceeds a breakdown voltage of the diode; and
discharge the capacitor when a voltage on the anode is greater than the voltage on the drain.

3. The circuit of claim 2, wherein charging the capacitor when the voltage on the drain exceeds the breakdown voltage of the diode includes charging the capacitor to a voltage that is equal to a drain-to-source voltage of the MOSFET minus the breakdown voltage of the diode.

4. The circuit of claim 2, wherein discharging the capacitor includes discharging the capacitor via the resistor.

5. The circuit of claim 1, wherein a breakdown voltage of the diode is less that a drain-to-source breakdown voltage of the MOSFET.

6. The circuit of claim 1, wherein the MOSFET and the snubber circuit are monolithically included in a semiconductor die.

7. The circuit of claim 1, wherein:
the MOSFET is included in a first semiconductor die; and
the snubber circuit is included in a second semiconductor die that is co-packaged with the first semiconductor die.

8. The circuit of claim 1, wherein:
the MOSFET, the diode and the resistor are included in a semiconductor die; and
the capacitor is a surface-mount capacitor disposed on the semiconductor die.

9. The circuit of claim 1, wherein:
the circuit is included in a power converter circuit; and
a breakdown voltage of the diode is greater than a supply voltage of the power converter circuit.

10. A semiconductor device comprising:
a semiconductor region of a first conductivity type;
an implant of a second conductivity type disposed in the semiconductor region, the second conductivity type being opposite the first conductivity type;
a metal-oxide semiconductor field-effect transistor (MOSFET) disposed in the semiconductor region, the MOSFET including:
a gate;
a source of the first conductivity type; and
a drain included in the semiconductor region;
a capacitor having:
a first terminal that is at least one of:
included, at least in part, in the implant; or
coupled with the implant;
a second terminal coupled with the source; and
a dielectric disposed between the first terminal and the second terminal; and
a resistor having:
a first terminal coupled with the source; and
a second terminal coupled with the implant,
the implant including an anode of a diode, and the semiconductor region including a cathode of the diode.

11. The semiconductor device of claim 10, where a drain-to source breakdown voltage of the MOSFET is greater than a breakdown voltage of the diode.

12. The semiconductor device of claim 10, wherein:
the dielectric is disposed on the implant on a surface of the semiconductor region; and
the second terminal of the capacitor includes a metal layer disposed on the dielectric of the capacitor, the metal layer being coupled with the source.

13. The semiconductor device of claim 10, wherein:
the capacitor is a metal-insulator-metal (MIM) capacitor;
the first terminal of the capacitor includes a first metal layer disposed on the implant; and
the second terminal of the capacitor includes a second metal layer disposed on the dielectric.

14. The semiconductor device of claim 13, wherein the MIM capacitor is a vertical, serpentine MIM capacitor.

15. The semiconductor device of claim 10, wherein:
the capacitor is a metal-insulator-metal (MIM) capacitor;
the second terminal of the capacitor includes:
a first metal layer disposed on the MOSFET, the dielectric being disposed on the first metal layer; and
a second metal layer disposed on the dielectric, the second metal layer being disposed on the dielectric and coupled with the first metal layer by at least one via formed through the dielectric; and
the second terminal of the capacitor is disposed within the dielectric.

16. The semiconductor device of claim 10, wherein:
the dielectric is disposed on the implant;
a metal layer is disposed on the dielectric, the metal layer being coupled with the implant by at least one contact formed through the dielectric; and
the second terminal of the capacitor is disposed within the dielectric, the capacitor including a first capacitor coupled in parallel with a second capacitor.

17. The semiconductor device of claim 10, wherein:
the second terminal of the capacitor is disposed in a dielectric-lined trench disposed in the semiconductor region, the dielectric-lining of the trench including the dielectric of the capacitor; and
the implant is disposed in a mesa of the semiconductor region adjacent to the dielectric-lined trench.

18. A semiconductor device comprising:
a first semiconductor die including a metal-oxide-semiconductor field-effect transistor (MOSFET), the first semiconductor die including:
a gate terminal of the MOSFET on a first surface;
a source terminal of the MOSFET on the first surface; and
a drain terminal of the MOSFET on a second surface, the second surface being opposite the first surface;
a second semiconductor die including:
a first terminal on a first surface;
a second terminal on a second surface opposite the first surface; and
a snubber circuit including:
a diode having a cathode coupled with the second terminal of the second semiconductor die;
a capacitor coupled between an anode of the diode and the first terminal of the second semiconductor die; and a resistor coupled between the anode and the first terminal of the second semiconductor die, such that the resistor is coupled in parallel with the capacitor;

a die-attach paddle, the second surface of the first semiconductor die and the second surface of the second semiconductor die being disposed on the die-attach paddle, such that the die-attach paddle couples the drain terminal of the MOSFET with the second terminal of the second semiconductor die; and an electrical connector coupling the source terminal of the MOSFET with the first terminal of the second semiconductor die.

19. The semiconductor device of claim 18, wherein a drain-to-source breakdown voltage of the MOSFET is greater than a breakdown voltage of the diode.

20. The semiconductor device of claim 19, wherein the snubber circuit is configured to:

charge the capacitor when a voltage on the drain terminal of the MOSFET exceeds the breakdown voltage of the diode; and discharge the capacitor when a voltage on the anode is greater than the voltage on the drain terminal.

* * * * *